United States Patent
Zhai et al.

(10) Patent No.: US 7,852,084 B2
(45) Date of Patent: Dec. 14, 2010

(54) MAGNETIC RESONANCE WITH TIME SEQUENTIAL SPIN EXCITATION

(75) Inventors: Zhiyong Zhai, Mayfield Heights, OH (US); Gordon D. DeMeester, Wickliffe, OH (US); Michael A. Morich, Mentor, OH (US); Paul R. Harvey, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 115 days.

(21) Appl. No.: 12/297,652

(22) PCT Filed: Apr. 3, 2007

(86) PCT No.: PCT/US2007/065841

§ 371 (c)(1), (2), (4) Date: Oct. 20, 2008

(87) PCT Pub. No.: WO2007/124245

PCT Pub. Date: Nov. 1, 2007

(65) Prior Publication Data

US 2009/0102483 A1    Apr. 23, 2009

Related U.S. Application Data

(60) Provisional application No. 60/745,290, filed on Apr. 21, 2006.

(51) Int. Cl.
*G01V 3/00* (2006.01)
(52) U.S. Cl. ...................... 324/318; 324/309
(58) Field of Classification Search ......... 324/300–322; 600/407, 410, 411, 422
See application file for complete search history.

(56) References Cited

U.S. PATENT DOCUMENTS 4,710,718 A * 12/1987 Shaka ....................... 324/309
6,608,480 B1   8/2003 Weyers
6,946,840 B1   9/2005 Zou et al.

(Continued)

FOREIGN PATENT DOCUMENTS

WO   2006033047 A2   3/2006

OTHER PUBLICATIONS

Collins, C. M., et al.; Strengths and Limitations of Pulsing Coils in an Array Sequentially to Avoid RF Intereference iin High Field MRI; 2005; Proc. Intl. Soc. Mag. Reson. Med.; 13:816.

(Continued)

*Primary Examiner*—Brij B Shrivastav

(57) ABSTRACT

In a magnetic resonance scanner, a main magnet (20, 22) generates a static magnetic field at least in an examination region. A magnetic field gradient system (30, 54) selectively superimposes magnetic field gradients on the static magnetic field at least in the examination region. A magnetic resonance excitation system (36, 36') includes at least one radio frequency coil (30, 301, 302, 303) arranged to inject radio frequency B1 fields into the examination region and at least two radio frequency amplifiers (38, 40, 40') coupled with different input ports of the at least one radio frequency coil. A controller (66, 70) controls the magnetic resonance excitation system to produce a time varying spatial B1 field distribution in a subject (16) in the examination region that time integrates to define a spatial tip angle distribution in the subject having reduced spatial non uniformity.

22 Claims, 5 Drawing Sheets

U.S. PATENT DOCUMENTS

| | | | |
|---|---|---|---|
| 6,975,114 | B1 * | 12/2005 | Ledden .................. 324/314 |
| 7,075,302 | B2 * | 7/2006 | Zhu ....................... 324/318 |
| 7,078,901 | B2 * | 7/2006 | Feiweier et al. ......... 324/318 |
| 7,166,999 | B2 * | 1/2007 | Duensing ................ 324/309 |
| 7,498,809 | B2 * | 3/2009 | Takahashi et al. ....... 324/309 |
| 2001/0033166 | A1 | 10/2001 | Hoult et al. |
| 2004/0012391 | A1 | 1/2004 | Vaughan, Jr. et al. |
| 2004/0150401 | A1 | 8/2004 | Eberler et al. |
| 2005/0099178 | A1 | 5/2005 | King et al. |
| 2005/0110487 | A1 | 5/2005 | Zhu |
| 2005/0174116 | A1 | 8/2005 | Leussler et al. |
| 2005/0194975 | A1 | 9/2005 | Duensing |
| 2005/0231203 | A1 | 10/2005 | Feiweier et al. |
| 2008/0129298 | A1 * | 6/2008 | Vaughan et al. ......... 324/322 |
| 2009/0021254 | A1 * | 1/2009 | Gore et al. .............. 324/309 |
| 2009/0273345 | A1 * | 11/2009 | Ruhm ..................... 324/309 |
| 2010/0052679 | A1 * | 3/2010 | Zelinski et al. .......... 324/309 |
| 2010/0066361 | A1 * | 3/2010 | Setsompop et al. ...... 324/309 |

OTHER PUBLICATIONS

Collins, C. M., et al.; Optimal Multiple-element Driving Configuration Depends on Head Geometry, Placement, and Volume of Interest; 2004; Proc. Intl. Soc. Mag. Reson. Med.; 11:1566.

Ibrahim, T. S., et al.; Effect of RF coil excitation on field inhomogeneity at ultra high fields: A field optimized TEM resonator; 2001; MRI; 19:1339-1347.

Junge, S., et al.; Integrated coil-setup for multiple-channel transmit applications at 200MHz; 2005; Proc. Intl. Soc. Mag. Reson. Med.; 13:918.

Katscher, U., et al.; Static and dynamic RF-shimming in the framework of transmit SENSE; 2005; Proc. Intl. Soc. Mag. Reson. Med.; 13:2256.

Levitt, M. H.; Symmetrical composite pulse sequences for NMR population inversion. I. Compensation of radiofrequency field inhomogeneity; 1982; J. Magnetic Resonance; 48:234-264.

Peshkovsky, A., et al.; Open volume TEM quadrature coil for high field imaging; 2004; Proc. Intl. Soc. Mag. Reson. Med.; 11:1556.

Ulloa, J. L., et al.; Exploring 3D RF shimming for slice selective imaging; 2005; Proc. Intl. Soc. Mag. Reson. Med.; 13:21.

* cited by examiner

US 7,852,084 B2

MAGNETIC RESONANCE WITH TIME SEQUENTIAL SPIN EXCITATION

CROSS REFERENCE TO RELATED APPLICATIONS

This application claims the benefit of U.S. provisional application Ser. No. 60/745,290 filed Apr. 21, 2006, which is incorporated herein by reference.

The present application relates to the magnetic resonance arts. It particularly relates to reducing spatial non-uniformity in magnetic resonance applications due to coil $B_1$ non-uniformity at ultra high field due to dielectric and conductivity effects by a subject, and is described with particular reference thereto. The following relates more generally to reducing spatial non-uniformity in magnetic resonance applications generally, such as due to coil loading, equipment imperfections, static ($B_0$) magnetic field non-uniformity, dielectric or eddy current effects, or so forth.

Radio frequency coils for use in magnetic resonance scanners are typically configured to produce a substantially uniform $B_1$ field within an examination region in the unloaded condition. That is, the radio frequency coil produces a substantially uniform $B_1$ field without a subject arranged in the examination region. Ideally, a subject placed in the examination region will therefore experience a substantially spatially uniform $B_1$ field that defines a substantially spatially uniform tip angle distribution of the spins throughout the subject, which is conducive to accurate magnetic resonance imaging and/or spectroscopy.

However, the insertion of an object, such as a human imaging subject, into the examination region can distort the $B_1$ field, especially at $B_0$ fields of 3T or higher. Such distortions are typically due to dielectric and/or conductivity effects, and are related to the RF wavelength in the object becoming comparable to the size of the object. Subject-induced $B_1$ field distortion and loading, becomes increasingly problematic as the asymmetry of the imaging subject increases (e.g., in the case of a "broad-shouldered" or otherwise asymmetric human imaging subject) and as the strength of the static (i.e., $B_0$) magnetic field increases. Hence, coil loading has become increasingly problematic as commercial magnetic resonance scanners have progressed from low-field (e.g., 0.23 Tesla, 1.5 Tesla) to progressively higher static magnetic fields (e.g., 3 Tesla, 7 Tesla, or so forth).

Loading the coil can also be more problematic for large coils that couple to a large examination region, both because of the larger subject size and the larger area over which a substantially uniform $B_1$ field is to be maintained. For large-volume imaging of human subjects, a quadrature body coil is sometimes used. Quadrature body coils provide efficient radio frequency coupling with a large region of interest such as a torso, legs, or other portion of a human imaging subject. A quadrature body coil is generally cylindrical in shape, and has radial symmetry. Examples include a quadrature birdcage body coil and a quadrature transverse-electromagnetic (TEM) body coil. The quadrature body coil includes I and Q channel input ports that are driven by radio frequency energy at a 90o phase difference to produce a rotating $B_1$ field for exciting magnetic resonance.

$B_1$ non-uniformity has been addressed in various ways.

In a post-acquisition processing approach, the acquired magnetic resonance data is corrected after acquisition to account for distortion of the $B_1$ field. While a correction for the receive coil sensitivity pattern can be made the excitation still has a distribution of tip angles that affects the MR experiment. The range of excited tip angles can be reduced by using adiabatic RF pulses but this approach is time and RF exposure expensive as well a limiting RE sequences.

In another approach, multiple independent radio frequency amplifiers are used to generate a custom $B_1$ field. For example, in the case of a quadrature body coil, each of the I and Q ports may be driven by a different amplifier. The amplitude and phase of each amplifier are selected to tailor the $B_1$ field distribution. This approach works well, except that the extent of $B_1$ field distribution tailoring is limited to four degrees of freedom, namely the amplitude and phase of each of the two amplifiers. To provide additional degrees of freedom, the radio frequency coil can be reconfigured to include additional ports that are connected with additional radio frequency amplifiers. For example, a TEM coil can be configured to have each rung, or each selected group of rungs, independently driven by a different radio frequency amplifier. For an eight element TEM coil, for example, up to eight amplifiers can be used providing sixteen degrees of freedom for tailoring the $B_1$ field.

The substantial flexibility in tailoring the $B_1$ field to compensate for coil loading using these approaches comes, however, at the cost of substantial increase in system complexity and cost. Radio frequency amplifiers are costly components. Each separately driven port requires its own waveform generation control, amplifier, and dedicated radio frequency cabling, trapping, and so forth. The additional radio frequency connections occupy valuable bore space and introduces opportunities for detrimental radio frequency cross-coupling.

In accordance with one aspect, a magnetic resonance scanner is disclosed. A main magnet generates a static magnetic field at least in an examination region. A magnetic resonance excitation system includes at least one radio frequency coil arranged to inject radio frequency energy into the examination region and at least two radio frequency amplifiers coupled with different input ports of the at least one radio frequency coil. A controller controls the magnetic resonance excitation system to produce a time-varying spatial $B_1$ field distribution in a subject in the examination region that time-integrates to define a spatial tip angle distribution in the subject having reduced spatial non-uniformity.

In accordance with another aspect, a magnetic resonance excitation method is disclosed. A $B_1$ non-uniformity imposed on at least one radio frequency coil by a subject coupled with the at least one radio frequency coil is determined. A time-varying spatial $B_1$ field distribution is generated in the subject using the at least one radio frequency coil. The time-varying spatial $B_1$ field distribution time-integrates to define a spatial tip angle distribution in the subject that is more spatially uniform than the time-varying spatial $B_1$ field distribution.

In accordance with another aspect, a magnetic resonance excitation apparatus is disclosed. Means are provided for determining a $B_1$ non-uniformity imposed on at least one radio frequency coil by a subject coupled with the at least one radio frequency coil. Means including the at least one radio frequency coil are provided for generating a time-varying spatial $B_1$ field distribution in the subject. The time-varying spatial $B_1$ field distribution time-integrates to define a spatial tip angle distribution in the subject having reduced spatial non-uniformity.

One advantage resides in providing flexible and effective compensation for $B_1$ field non-uniformity.

Another advantage resides in providing compensation for different types of patterns of $B_1$ non-uniformity without using different compensation coils or other loading-specific hardware.

Another advantage resides in acquisition of more accurate magnetic resonance data with reduced effects of $B_1$ non-uniformity.

Another advantage resides in improved reconstructed image quality.

Another advantage resides in improved magnetic resonance spectra.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 1 diagrammatically shows a magnetic resonance scanner including a quadrature body coil, two independent radio frequency amplifiers separately driving the I and Q input ports of the quadrature body coil, and a two channel scanner controller with temporal sequencer for exciting a time-varying spatial $B_1$ field distribution.

FIG. 2 diagrammatically shows the magnetic resonance excitation system of the magnetic resonance scanner of FIG. 1 in greater detail.

Figure 1:
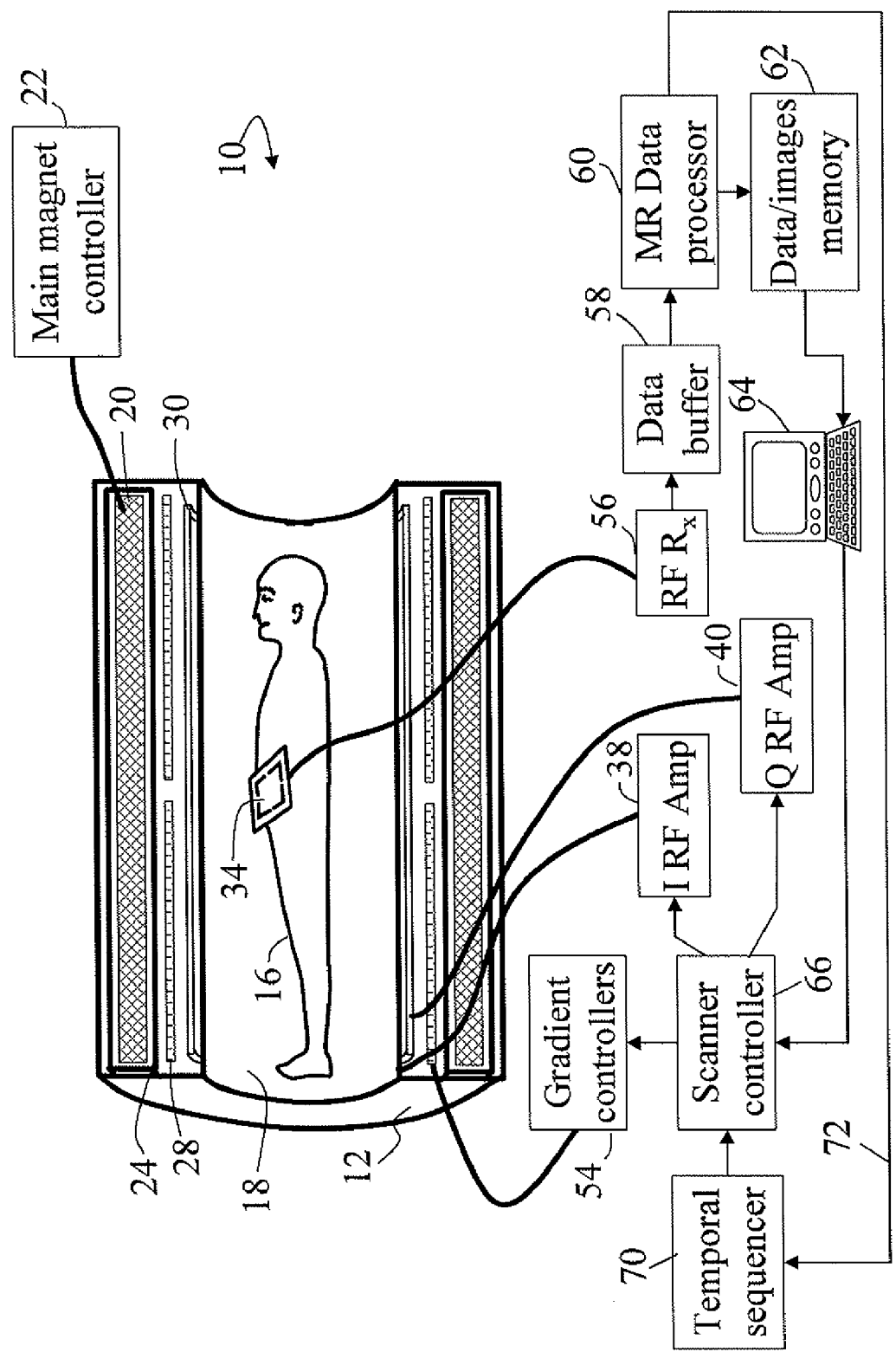
Figure 7:
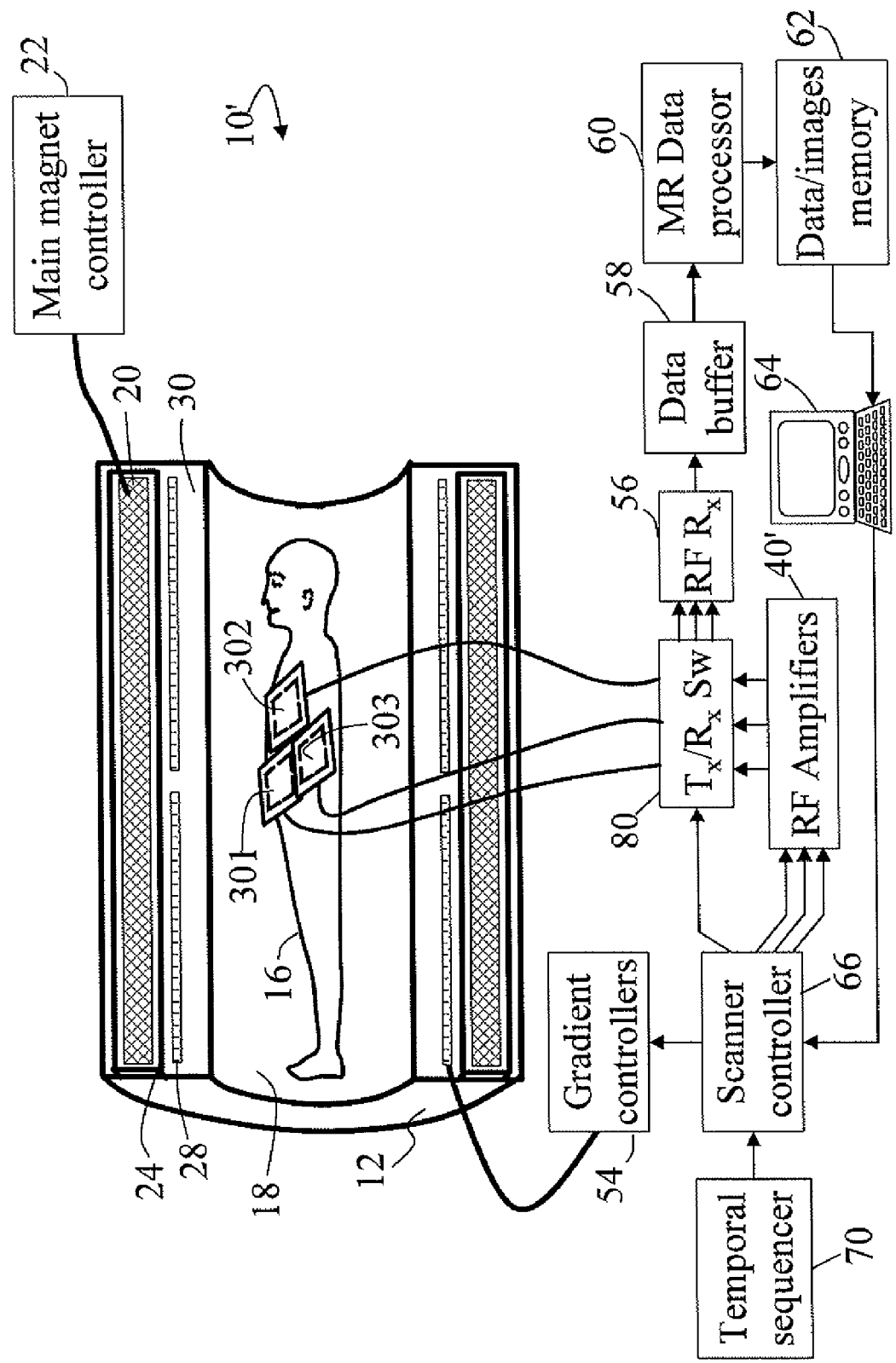

FIG. 7 diagrammatically shows another magnetic resonance scanner employing a plurality of local coils in place of the quadrature body coil of FIG. 1.

Figure 8:
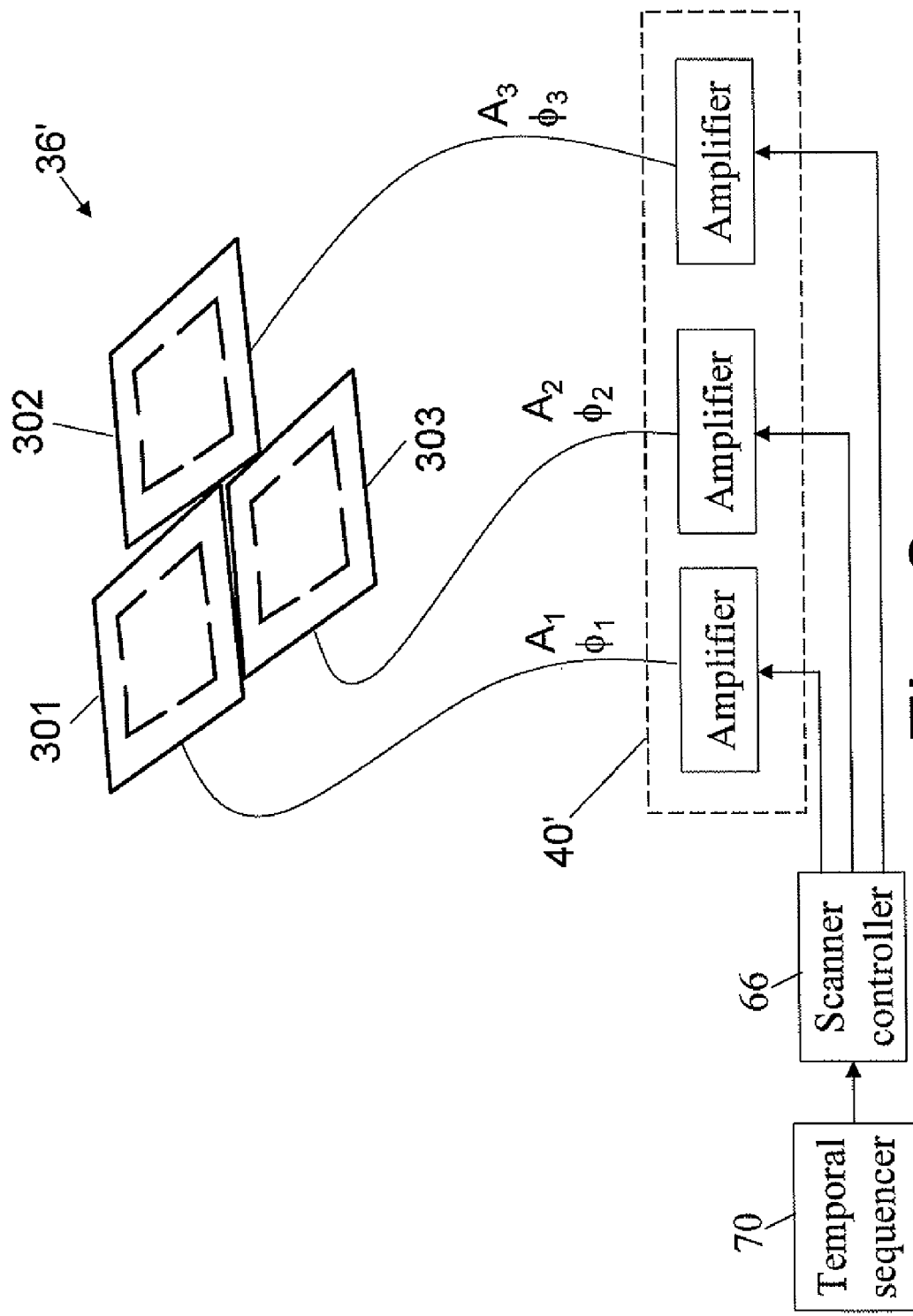

FIG. 8 diagrammatically shows the magnetic resonance excitation system of the magnetic resonance scanner of FIG. 7 in greater detail.

With reference to FIG. 1, a magnetic resonance scanner 10 includes a scanner housing 12 in which a patient 16 or other subject is at least partially disposed. A protective insulating bore liner 18 of the scanner housing 12 optionally lines a generally cylindrical bore or opening of the scanner housing 12 inside of which the subject 16 is disposed. A main magnet 20 disposed in the scanner housing 12 is controlled by a main magnet controller 22 to generate a static ($B_0$) magnetic field in at least a scanning region including at least a portion of the subject 16. Typically, the main magnet 20 is a persistent superconducting magnet surrounded by cryoshrouding 24. In some embodiments, the main magnet 20 generates a main magnetic field of at least about 0.2 Tesla, such as 0.23 Tesla, 1.5 Tesla, 3 Tesla, 7 Tesla, or so forth. Magnetic field gradient coils 28 are arranged in or on the housing 12 to superimpose selected magnetic field gradients on the main magnetic field in at least the scanning region. Typically, the magnetic field gradient coils include coils for producing three orthogonal magnetic field gradients, such as x-gradient, y-gradient, and z-gradient.

A generally cylindrical quadrature body coil 30 is mounted substantially coaxially with the bore of the magnetic resonance scanner 10. In some embodiments, the quadrature body coil 30 is a permanent fixture mounted inside the scanner housing 12. In some embodiments, the quadrature body coil 30 is mounted on a dielectric former or other holder that can be slidably inserted into and removed from the bore of the magnetic resonance scanner 10, or slidably inserted into and removed from an annular receptacle of the scanner housing 12. In other embodiments, the quadrature coil 30 can be a local quadrature coil, such as a head quadrature coil or a knee quadrature coil. In some embodiments the quadrature body coil 30 is a quadrature birdcage coil including a plurality of rungs arranged generally parallel with the axis of the bore and operatively interconnected by two or more endrings, endcaps, or other terminating structures disposed at or near the opposite ends of the rungs. In some embodiments the quadrature body coil 30 is a quadrature transverse-electromagnetic (TEM) coil including a plurality of rods arranged generally parallel with the axis of the bore and operatively interconnected by a generally annular radio frequency shield or screen substantially surrounding the rods. The quadrature body coil 30 optionally includes capacitances, inductances, resistances, chokes, transistors, relays, or other components for providing radio frequency tuning, decoupling, current blocking or trapping, or other functionality.

In some embodiments, the quadrature body coil 30 performs both transmit and receive functions. That is, the quadrature body coil 30 is externally energized to excite magnetic resonance in the subject 16, and is also used to receive magnetic resonance signals generated by the excitation. In some embodiments, the quadrature body coil 30 performs the transmit function, and a separate receive coil 34 receives magnetic resonance signals generated by the excitation. The optional separate receive coil 34 can be a surface coil as illustrated, or a surface coils array, or an arm coil, leg coil, or other local coil. In some embodiments, the scanner 10 is configurable so that in some imaging applications the quadrature body coil 30 performs both transmit and receive functions while in other imaging applications the quadrature body coil 30 performs the transmit function and a separate receive coil performs the receive function. The optional separate receive coil 34 typically includes detuning circuitry that detunes the receive coil during the transmit phase to avoid overloading the receive coil.

Figure 2:
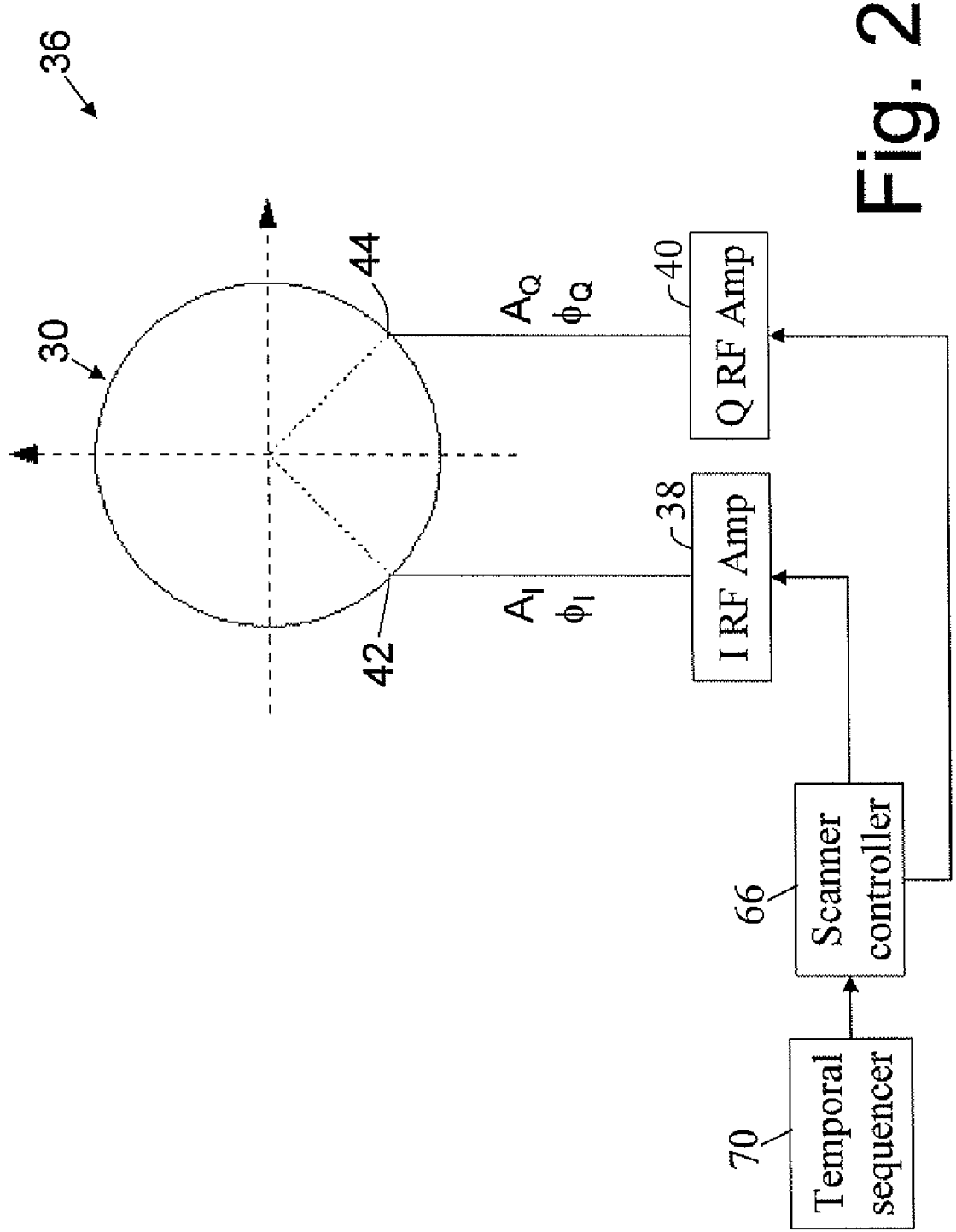

With continuing reference to FIG. 1 and with further reference to FIG. 2 which shows a magnetic resonance excitation system 36 of the magnetic resonance scanner of FIG. 1 in greater detail, an I-channel radio frequency amplifier 38 generates an I-channel radio frequency drive signal having an amplitude $A_I$ and a phase $\phi_I$ at the magnetic resonance frequency, while a Q-channel radio frequency amplifier 40 generates a Q-channel radio frequency drive signal having an amplitude $A_Q$ and a phase $\phi_Q$ at the same magnetic resonance frequency. The I-channel and Q-channel radio frequency drive signals are independent in that they may have different amplitudes $A_I$, $A_Q$ (within the limits imposed by the dynamic ranges of the amplifiers 38, 40) and different relative phases $\phi_I$, $\phi_Q$. The I-channel drive signal output by the I-channel radio frequency amplifier 38 is fed into an I-channel input port 42 of the quadrature body coil 30. The Q-channel drive signal output by the Q-channel radio frequency amplifier 40 is fed into a Q-channel input port 44 of the quadrature body coil 30.

If the I-channel and Q-channel radio frequency drive signals are of equal amplitude ($A_I=A_Q$) with a 90° phase difference between the I- and Q-channel radio frequency drive signals ($\phi_Q-\phi_I=90°$), then the quadrature body coil 30 is operated in the usual quadrature mode that produces a $B_1$ field vector that rotates at the magnetic resonance frequency. However, if two separate RF waveform generators and two independent amplifiers 38, 40 are provided, there is in general no restriction on the I- and Q-channel radio frequency drive signal amplitudes $A_I$, $A_Q$ and the phase difference $\phi_Q-\phi_I$ therebetween.

With reference to FIG. 1, optionally a magnetic field gradients controller 54 operates the magnetic field gradient coils 28 to spatially localize the magnetic resonance excitation to a slab or other localized region. Optionally, the magnetic field gradient controller 54 operates the magnetic field gradient coils 28 to apply one or more spatial encoding magnetic field gradient pulses.

In the embodiment of FIG. 1, a radio frequency receiver 56 is operatively connected with the illustrated local coil 34 to read magnetic resonance signals during a readout phase of the magnetic resonance sequence. Alternatively, in some embodiments the radio frequency receiver 56 is operatively coupled with the I and Q channel input ports 42, 44 of the quadrature body coil 30 during the readout phase, with suitably radio frequency circuitry being provided to switch between operative connection of the quadrature body coil 30 with the radio frequency amplifiers 38, 40 during the transmit phase and operative connection with the radio frequency receiver 56 during the readout phase. Optionally, the magnetic field gradient controller 54 operates the magnetic field gradient coils 28 during the readout phase to provide additional spatial encoding (i.e., readout encoding) of the magnetic resonance signals.

The magnetic resonance samples acquired during the readout are stored in a data buffer 58. A magnetic resonance data processor 60 performs processing of the acquired magnetic resonance data to extract useful information. In imaging applications, the data processor 60 suitably performs image reconstruction using a Fast Fourier transform or other image reconstruction algorithms comporting with the selected spatial encoding applied during generation of the magnetic resonance data. In spectroscopic applications, the processing performed by the data processor 60 may include, for example, performing spectral fast Fourier transform operations to recover chemical shift and J-coupling data. The resulting processed data (e.g., images, spectra, or so forth) are suitably stored in a data/images memory 62, displayed on a user interface 64, printed, communicated over the Internet or a local area network, stored on a non-volatile storage medium, or otherwise used. In the example configuration illustrated in FIG. 1, the user interface 64 also interfaces a radiologist or other operator with the scanner controller 66 to control the magnetic resonance scanner 10. In other embodiments, a separate scanner control interface may be provided.

With reference to FIGS. 1 and 2, the magnetic resonance excitation system 36 is configured to allow time-averaging of a $\overline{B}_1(\vec{r})$ field so as to compensate for $B_1$ spatial non-uniformity. In this notation, $\vec{r}$ denotes spatial position, so that $\overline{B}_1(\vec{r})$ denotes the spatial $B_1$ field distribution. Applying a time-invariant $\overline{B}_1(\vec{r})$ field for a time $\tau$ produces a spatial tip angle distribution $\theta(\vec{r})$ given by:

$$\theta(\vec{r}) = \int_0^\tau \gamma |B_1^+(\vec{r})| dt, \quad (1)$$

where $\gamma$ is the gyromagnetic ratio and $|\overline{B}_1+(\vec{r})|$ is the component of the $\overline{B}_1(\vec{r})$ vector that contributes to magnetic resonance excitation. For the time-invariant $\overline{B}_1(\vec{r})$ field the component $|\overline{B}_1+(\vec{r})|$ is independent of time, and Equation (1) simplifies to:

$$\theta(\vec{r}) = \gamma |B_1^+(\vec{r})| \cdot \tau, \quad (2)$$

where $\tau$ is the duration of application of the constant $|B_1^+|$ field.

The magnetic resonance scanner 10 includes the capability of generating a time-varying spatial $\overline{B}_1(\vec{r})$ field distribution that varies in spatial shape, by independently controlling the I and Q channel radio frequency amplifiers 38, 40. Denoting the time-varying spatial $\overline{B}_1(\vec{r})$ field distribution as $\overline{B}_1(\vec{r},t)$ where t denotes time, Equation (1) becomes:

$$\theta(\vec{r}) = \int_0^\tau \gamma |B_1^+(\vec{r}, t)| dt. \quad (3)$$

If only a single radio frequency amplifier was used in conjunction with a hybrid circuit to produce the I and Q components, then the time-varying spatial $\overline{B}_1(\vec{r},t)$ field distribution could only be varied in amplitude or phase—that is, the spatial shape of the spatial $\overline{B}_1(\vec{r},t)$ field distribution could not be varied. This is the case with a typical MR system. In contrast, in the scanner 10 the time-varying spatial $\overline{B}_1(\vec{r},t)$ field distribution can have varying shape.

Figure 3:
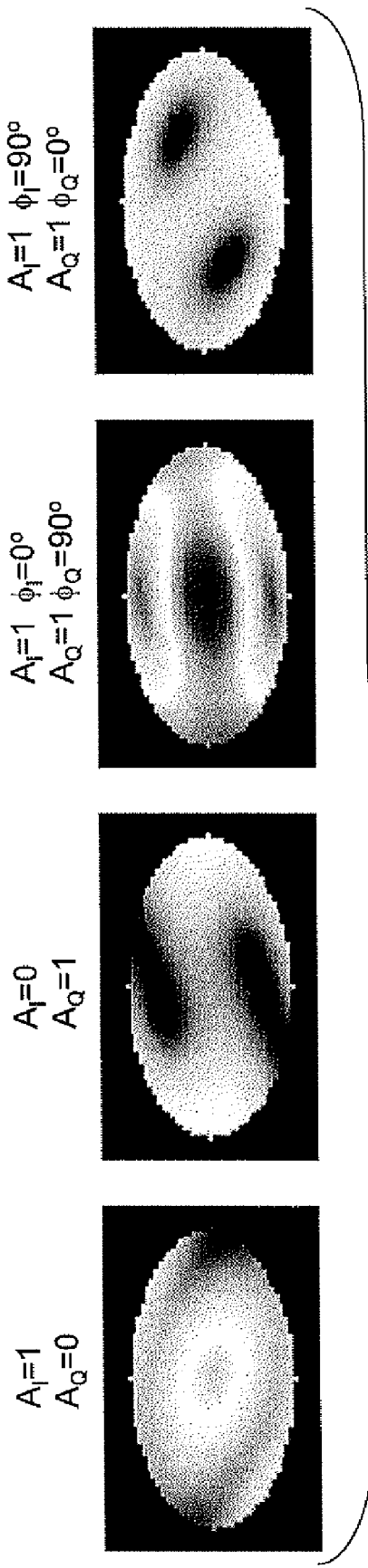
FIG. 3 show spatial $B_1$ field distributions for modeling of an elliptical cardiac phantom placed in a quadrature body coil in a 3 Tesla magnetic field, for four different excitation conditions.

FIG. 3 shows spatial $\overline{B}_1(\vec{r},t)$ field distributions for modeling of an elliptical cardiac phantom (aspect ratio=19 cm/35 cm=0.54, length=34 cm, conductivity=0.5 S/m, and relative permittivity=78) placed in a quadrature body coil in a 3 Tesla static ($B_0$) magnetic field. FIG. 3 shows the spatial $\overline{B}_1(\vec{r},t)$ field distributions for four conditions: $A_I=1$, $A_Q=0$ (i.e., driving only the I channel using the I-channel amplifier 38); $A_I=0$, $A_Q=1$ (i.e., driving only the Q channel using the Q-channel amplifier 40); $A_I=1$, $A_Q=1$, $\phi_I=0°$, $\phi_Q=90°$ (i.e., driving the quadrature body coil 30 in quadrature mode using both amplifiers 38, 40); and $A_I=1$, $A_Q=1$, $\phi_I=90°$, $\phi_Q=0°$ (i.e., driving the quadrature body coil 30 in anti-quadrature mode using both amplifiers 38, 40). In the $|B_1^+|$-field maps of FIG. 3 (as well as those of FIGS. 4-6), regions of about average $|B_1^+|$-field intensity are shown with whiter grayscale values; whereas, regions of low or high $|B_1^+|$-field intensity are shown with darker grayscale values. That is, relatively uniform regions are whiter, while regions substantially contributing to non-uniformity are darker. Substantial spatial non-uniformities are seen for each of the coil operational modes, principally due to dielectric and eddy current effects in the cardiac phantom.

By suitably combining different spatial $\overline{B}_1(\vec{r},t)$ field distributions in time, a time-varying spatial $B_1$ field distribution can be produced in a subject that time-integrates to define a spatial tip angle distribution in the subject having reduced spatial non-uniformity. The combination can be continuous, e.g. by applying Equation (3), or can involve combining two or more time-invariant spatial $B_1$ field distributions each held constant over selected time interval $\tau$. For example, the amplifiers 38, 40 can be controlled by the controller 66 to produce a first time-invariant spatial $B_1$ field distribution $|\overline{B}_1^+(\vec{r})|_{(1)}$ over a time $\tau_1$ and a second time-invariant spatial $B_1$ field distribution $|\overline{B}_1^+(\vec{r})|_{(2)}$ over a time $\tau_2$, the first and second time-invariant spatial $B_1$ field distributions being different due to different RF excitation conditions. The combined tip angle $\theta(\vec{r})$ is given by a linear combination of Equation (2):

$$\theta(\vec{r}) = \gamma |B_1^+(\vec{r})|_{(1)} \cdot \tau_1 + \gamma |B_1^+(\vec{r})|_{(2)} \cdot \tau_2. \quad (4)$$

If a third time-invariant spatial $B_1$ field distribution $|\overline{B}_1^+(\vec{r})|_{(3)}$ is applied over a time $\tau_3$, where the first, second, and third time-invariant spatial $B_1$ field distributions are different, then the resulting tip angle $\theta(\vec{r})$ is given by:

$$\theta(\vec{r}) = \gamma |B_1^+(\vec{r})|_{(1)} \cdot \tau_1 + \gamma |B_1^+(\vec{r})|_{(2)} \cdot \tau_2 + \gamma |B_1^+(\vec{r})|_{(3)} \cdot \tau_3. \quad (5)$$

More generally still, if N different time-invariant spatial $B_1$ field distributions $|\overline{B}_1^+(\vec{r})|_{(n)}$ are applied each for a selected time $\tau_n$, where n=1 ... N indexes the applied time-invariant spatial field distributions, then the resulting tip angle $\theta(\bar{r})$ is given by:

$$\theta(\bar{r}) = \gamma \sum_{n=1}^{N} |B_1^+(\bar{r})|_{(n)} \cdot \tau_n. \quad (6)$$

Figure 6:
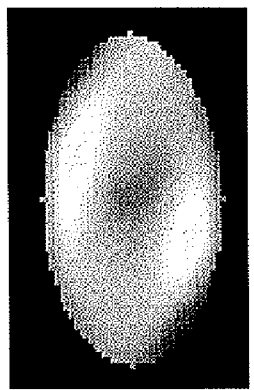
FIG. 6 shows a spatial tip angle distribution for a time-integrated combination of the time-invariant $B_1$ field distributions of FIGS. 4 and 5.
Figure 5:
FIGS. 4 and 5 show spatial tip angle distributions produced by two different time-invariant $B_1$ field distributions.
Figure 4:
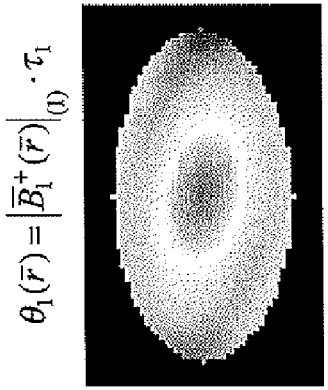

FIGS. 4-6 show an application of Equation (4). FIG. 4 shows a spatial tip angle distribution $\theta_1(\bar{r})$ produced by a time-invariant $|\bar{B}_1^+(\bar{r})|_{(1)}$ field distribution in which $A_I=1$, $A_Q=0.1$, $\phi_I=0°$, $\phi_Q=40°$ applied for a time interval $\tau_1$. FIG. 5 shows a spatial tip angle distribution $\theta_2(\bar{r})$ produced by a time-invariant $|\bar{B}_1^+(\bar{r})|_{(2)}$ field distribution in which $A_I=0.4$, $A_Q=0.9$, $\phi_I=120°$, $\phi_Q=0°$ applied for a time interval $\tau_2$. In the spatial tip angle distribution $\theta_1(\bar{r})$ of FIG. 4, the central region represents a large tip angle of about 90-120°, while in the spatial tip angle distribution $\theta_2(\bar{r})$ of FIG. 5, the central region represents a small tip angle of about 0-40°.

FIG. 6 shows a spatial tip angle distribution $\theta(\bar{r})$ for the time-integrated combination of the time-invariant $|\bar{B}_1^+(\bar{r})|_{(1)}$ and $|\bar{B}_1^+(\bar{r})|_{(2)}$ field distributions of FIGS. 4 and 5 combined in accordance with Equation (4) with $\tau_1=\tau_2$. The field spatial tip angle distribution $\theta(\bar{r})$ of FIG. 6 has a tip angle of 90°±9.25°, with a 67% decrease in standard deviation versus operation of the coil 30 in quadrature. While FIG. 6 shows a combination of two different time-invariant $B_1$ field distributions $|\bar{B}_1^+(\bar{r})|_{(1)}$ and $|\bar{B}_1^+(\bar{r})|_{(2)}$, it is anticipated that by selectively combining three different time-invariant $B_1$ field distributions in accordance with Equation (5), or four or more different time-invariant $B_1$ field distributions in accordance with Equation (6), can provide still further reduced spatial nonuniformity in the spatial tip angle distribution $\theta(\bar{r})$. In general, it can be expected that it will usually be possible to combine two selected different time-invariant $B_1$ field distributions so as to produce a spatial tip angle distribution $\theta(\bar{r})$ that is more spatially uniform than either constituent time-invariant spatial $B_1$ field distribution. Similarly, it can be expected that a time-varying spatial $B_1$ field distribution can be chosen to produce a spatial tip angle distribution that is more spatially uniform than the time-varying spatial $B_1$ field distribution.

With reference to FIGS. 1 and 2, the time-invariant spatial $B_1$ field distribution used to create a more uniform spatial tip angle distribution can be either continuously varying (analyzed using Equation (3)) or discretely varying (analyzed using Equations (4)-(6)). In the continuously varying approach, the controller 66 controls the radio frequency amplifiers 38, 40 to generate output radio frequency signals with amplitudes $A_I(t)$, $A_Q(t)$ and phases $\phi_I(t)$, $\phi_Q(t)$ that are functions of time to produce a time-varying field distribution $|\bar{B}_1^+(\bar{r},t)|$ that time-integrates in accordance with Equation (3) to produce a spatial tip angle distribution $\theta(\bar{r})$ having reduced spatial non-uniformity. In the discretely varying approach, the controller 66 controls the radio frequency amplifiers 38, 40 to generate a temporal sequence of time-invariant output radio frequency signals each having amplitudes $A_{I(n)}$, $A_{Q(n)}$ and phases $\phi_{I(n)}$, $\phi_{Q(n)}$ that produce time-invariant field distributions $|\bar{B}_1^+(\bar{r})|_{(n)}$ that sum in accordance with Equation (6) to produce a spatial tip angle distribution $\theta(\bar{r})$ having reduced spatial non-uniformity. A temporal sequencer 70 determines suitable continuous functions $A_I(t)$, $A_Q(t)$, $\phi_I(t)$, $\phi_Q(t)$ or discrete values $A_{I(n)}$, $A_{Q(n)}$, $\phi_{I(n)}$, $\phi_{Q(n)}$ that provide the spatial tip angle distribution $\theta(\bar{r})$ having reduced spatial non-uniformity based on a determination of the coil loading imposed on the radio frequency coil 30 by a subject in the examination region.

The determination of $B_1$ non-uniformity can be done in various ways. In some embodiments, a pre-scan is performed and an image of the subject reconstructed, and the $B_1$ non-uniformity estimated from the reconstructed image. In other embodiments, the $B_1$ non-uniformity may be estimated based on measurements of the dimensions of the subject. For example, the shoulder width and chest diameter of a human subject may be measured to estimate the amount of $B_1$ non-uniformity the human subject will impose upon the coil. In some embodiments, the temporal sequencer 70 includes a look-up table of continuous functions $A_I(t)$, $A_Q(t)$, $\phi_I(t)$, $\phi_Q(t)$ or discrete values $A_{I(n)}$, $A_{Q(n)}$, $\phi_{I(n)}$, $\phi_{Q(n)}$ that provide substantial uniformity for the spatial tip angle distribution $\theta(\bar{r})$. The look-up table values are suitably pre-determined by finite element analysis simulations, or by experimental measurements on phantoms or human objects with different aspect ratios, or so forth. In other embodiments, the temporal sequencer 70 may include a finite element analysis electromagnetic simulator or other calculator for estimating suitable values of the continuous functions $A_I(t)$, $A_Q(t)$, $\phi_1(t)$, $\phi_Q(t)$ or discrete values $A_{I(n)}$, $A_{Q(n)}$, $\phi_{I(n)}$, $\phi_{Q(n)}$ that provide substantial uniformity for the spatial tip angle distribution $\theta(\bar{r})$. That is, in the discrete embodiment a composite $B_1$ pulse or pulse packet is applied by the amplifiers 38, 40 which includes a series of two (Equation (4)), three (Equation (5)), or N (Equation (6)) sub-pulses which cumulatively produce the selected spatial tip angle distribution. Each sub-pulse has a selectable amplitude, phase, and/or duration to provide numerous degrees of freedom in tailoring the overall $B_1$ pulse or pulse packet.

In some embodiments, a sensor, sensor array or analyzer detects or measures the $B_1$ field distribution to provide feedback 72 of the actual applied $B_1$ field at the region of interest. In these embodiments, a series of pilot $B_1$ pulses are suitably applied and the detected or measured $B_1$ field distribution is used by the temporal sequencer 70 to dynamically or iteratively adjust the $B_1$ sub-pulses or $B_1$ pulse shape to achieve the desired spatial tip angle distribution. For these embodiments, a dedicated sensor, sensor array or analyzer can be used, or the receive coil 34 can be used as the sensor, along with suitable processing performed by the data processor 60 or another processor, to produce the feedback 72 for dynamically or iteratively tailoring the $B_1$ sub-pulses or $B_1$ pulse shapes.

With reference to FIGS. 7 and 8, the technique of using a time-varying field distribution $|\bar{B}_1^+(\bar{r},t)|$ that time-integrates (for example, using a suitable one of Equations (3)-(6)) to define a spatial tip angle distribution in the subject that is more spatially uniform than the time-varying spatial $B_1$ field distribution can be applied to other magnetic resonance excitation systems. A magnetic resonance scanner 10' includes a different magnetic resonance excitation system 36' in which the quadrature body coil 30 is replaced by an array of local coils 301, 302, 303. While three local surface coils 301, 302, 303 are shown, other types and/or numbers of local coils can be used. The I-channel and Q-channel radio frequency amplifiers 38, 40 are replaced by a set of three radio frequency amplifiers 40' that are independently controlled by the scanner controller 66. More generally, each local coil 301, 302, 303 has an input port that is coupled to its own independent amplifier—accordingly, the local coil 301 can be operated at amplitude $A_1(t)$ and phase $\phi_1(t)$, the local coil 302 can be operated at amplitude $A_2(t)$ and phase $\phi_2(t)$, and the local coil 303 can be operated at amplitude $A_3(t)$ and phase $\phi_3(t)$. In the embodiment of FIG. 7, the local coils 301, 302, 303 operate as transmit/receive ($T_x/R_x$) coils that are selectively coupled with either the radio frequency amplifiers 40' or the radio frequency receiver 56 by a suitable switch 80. The time-varying $B_1$ field distribution $|\bar{B}_1^+(\bar{r},t)|$ is generated by the combination of local coils 301, 302, 303 based on the time-varying amplitudes $A_1(t)$, $A_2(t)$, $A_3(t)$ and time-varying phases $\phi_I(t)$, $\phi_2(t)$, $\phi_3(t)$. As in the quadrature body coil embodiment, the time integration can be either continuous (where $A_1(t)$, $A_2(t)$, $A_3(t)$, $\phi_1(t)$, $\phi_2(t)$, $\phi_3(t)$ are in general continuous functions of time) or discrete (where the amplitudes and phases are varied discretely, e.g. $A_{1(n)}$, $A_{2(n)}$, $A_{3(n)}$, $\phi_{1(n)}$, $\phi_{2(n)}$, $\phi_{3(n)}$ where n=1 . . . N denotes the number of discrete time-invariant $B_1$ field distributions $|\bar{B}_1^+(\bar{r})|_{(n)}$ that are combined in accordance with Equation (6).

The example magnetic resonance excitation systems 36, 36' are not exhaustive. As another example of a suitable magnetic resonance excitation system, a degenerate birdcage or TEM coil can be used, with individual rungs or rods driven by separate radio frequency amplifiers in accordance with the techniques disclosed herein.

It is to be appreciated that less than all of the coil parameters may be varied. For example, referencing back to the embodiment of FIGS. 1 and 2, in some instances it may be sufficient to keep $A_I$ and $\phi_I$ constant (that is, the output of amplifier 38 is held constant) and to vary $A_Q$ and $\phi_Q$ continuously or discretely to effectuate the time-varying $B_1$ field distribution $|\bar{B}_1^+(\bar{r},t)|$. Indeed, it may be sufficient to vary only $A_Q$ or only $\phi_Q$ continuously or discretely to effectuate the time-varying $B_1$ field distribution $|\bar{B}_1^+(\bar{r},t)|$.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance scanner comprising:
    a main magnet for generating a static magnetic field at least in an examination region;
    a magnetic resonance excitation system including:
        a quadrature coil having I and Q input ports, the quadrature coil being arranged to inject radio frequency energy into the examination region;
        an I channel radio frequency amplifier coupled with the I input port; and
        a Q channel radio frequency amplifier coupled with the Q input port; and
    a controller that controls the magnetic resonance excitation system to produce a time-varying spatial $B_1$ field distribution in a subject in the examination region that time integrates to define a spatial tip angle distribution in the subject having reduced spatial non uniformity.

2. The magnetic resonance scanner as set forth in claim 1, wherein the quadrature coil is one of a quadrature body coil and a quadrature head quadrature coil.

3. The magnetic resonance scanner as set forth in claim 1, wherein the magnetic resonance excitation system includes:
    a plurality of local coils each having an input port; and
    a radio frequency amplifier coupled with the input port of each local coil.

4. The magnetic resonance scanner as set forth in claim 1, further including:
    a sensor, sensor array or analyzer which provides feedback on the $B_1$ field distribution.

5. The magnetic resonance scanner as set forth in claim 1, wherein the controller controls each of the I channel and the Q channel radio frequency amplifiers to produce at least a first time-invariant spatial $B_1$ field distribution over a time $\tau_1$ and a second time-invariant spatial $B_1$ field distribution over a time $\tau_2$, the first and second time-invariant spatial $B_1$ field distributions being different.

6. The magnetic resonance scanner as set forth in claim 5, wherein the controller controls each of the I channel and the Q channel radio frequency amplifiers to further produce a third time-invariant spatial $B_1$ field distribution over a time $\tau_3$, the first, second, and third time-invariant spatial $B_1$ field distributions being different.

7. The magnetic resonance scanner as set forth in claim 1, wherein the controller controls each of the I channel and the Q channel radio frequency amplifiers to produce continuously time-varying spatial $B_1$ field distributions over a time $\tau$.

8. The magnetic resonance scanner as set forth in claim 1, wherein the controller controls each of the I channel and the Q channel radio frequency amplifiers to produce time-varying radio frequency signals to cause the quadrature coil to produce the time-varying spatial $B_1$ field distribution.

9. The magnetic resonance scanner as set forth in claim 8, wherein the at least one time-varying radio frequency signals include a time-varying amplitude and a time-varying phase.

10. The magnetic resonance scanner as set forth in claim 1, wherein the controller includes:
    a look up table specifying a plurality of different sets of radio frequency signals corresponding to different coil loadings of the quadrature coil, each set of radio frequency signals being configured to be applied by the I channel and Q channel radio frequency amplifiers to produce a time-varying spatial $B_1$ field distribution that time integrates to define a spatial tip angle distribution having reduced spatial non uniformity for the corresponding coil loading.

11. The magnetic resonance scanner as set forth in claim 1, wherein the controller controls each of the amplifiers to apply a composite pulse made up of a plurality of sub pulses, each sub pulse having a selectable amplitude, phase, and duration.

12. A magnetic resonance excitation method comprising:
    determining $B_1$ non-uniformity imposed on at least one radio frequency coil by a subject coupled with the at least one radio frequency coil; and
    generating a time-varying spatial $B_1$ field distribution in the subject using the at least one radio frequency coil, the time-varying spatial $B_1$ field distribution time integrating to define a spatial tip angle distribution in the subject that is more spatially uniform than the time-varying spatial $B_1$ field distribution, including:
        generating a first composite pulse made up of at least three sub-pulses, each sub-pulse having a selectable amplitude, phase, and duration.

13. The magnetic resonance excitation method as set forth in claim 12, wherein each of the sub-pulses is different with regard to at least one of the amplitude, phase, and duration.

14. The magnetic resonance excitation method as set forth in claim 13, wherein the generating further includes:
    generating a second composite pulse made up of at least three sub-pulses, each sub-pulse having a selectable amplitude, phase, and duration.

15. The magnetic resonance excitation method as set forth in claim 14, further including:
    applying the first composite pulse to an I input port of a quadrature coil and the second composite pulse to a Q input port of the quadrature coil.

16. The magnetic resonance excitation method as set forth in claim 14, further including:
    selecting the amplitude, phase, and duration of each sub-pulse by inputting physical characteristics of the subject into a look-up table and retrieving the amplitude, the phase, and the duration for each sub-pulse from the look-up table.

17. A magnetic resonance scanner with a controller programmed to operate the scanner according to the method of claim 12.

18. The magnetic resonance excitation method as set forth in claim 12, further including:

sensing a spatial tip angle distribution defined in the subject; and, adjusting at least one of the amplitude, the phase, and the duration of at least one of the first and second composite pulses.

19. A magnetic resonance excitation apparatus comprising:

a look-up table for determining a $B_1$ non-uniformity imposed on at least one radio frequency coil by a subject coupled with the at least one radio frequency coil, the look-up table being preprogrammed to correlate an aspect ratio of the subject with a time-varying spatial $B_1$ field distribution to be generated in the subject, the time-varying spatial $B_1$ field distribution time integrating to define a spatial tip angle distribution in the subject having reduced spatial non uniformity;

a controller which receives the time-varying spatial $B_1$ field distribution from the look-up table and controls at least one radio frequency amplifier to produce the received time-varying spatial $B_1$ field distribution in the subject.

20. The magnetic resonance excitation apparatus as set forth in claim 19, wherein the at least one radio frequency coil is a quadrature coil, and the at least one radio frequency amplifier includes:

two radio frequency amplifiers coupled with two quadrature ports of the quadrature coil, each of the two radio frequency amplifiers outputting at least one of a time-varying radio frequency amplitude and a time-varying radio frequency phase.

21. The magnetic resonance excitation apparatus as set forth in claim 19, wherein the controller controls the at least one radio frequency amplifier to apply a composite pulse made up of at least three sub-pulses, each sub-pulse having a selectable amplitude, phase, and duration.

22. The magnetic resonance excitation apparatus as set forth in claim 19, wherein the at least one radio frequency coil includes a plurality of local coils.

\* \* \* \* \*